United States Patent [19]
Watanabe

[11] Patent Number: 5,736,911
[45] Date of Patent: Apr. 7, 1998

[54] PIEZOELECTRIC RESONATOR WITH A RESONANCE FREQUENCY ADJUSTING NOTCH

[75] Inventor: Toru Watanabe, Nagaokakyo, Japan

[73] Assignee: Murata Manufacturing Co., Ltd., Japan

[21] Appl. No.: 777,571

[22] Filed: Dec. 31, 1996

Related U.S. Application Data

[63] Continuation of Ser. No. 647,013, May 8, 1996, abandoned, which is a continuation of Ser. No. 429,892, Apr. 27, 1995, abandoned.

[30] Foreign Application Priority Data

Apr. 27, 1994 [JP] Japan .................................. 6-090264

[51] Int. Cl.⁶ .................................................. H03H 9/15
[52] U.S. Cl. ........................ 333/188; 310/312; 310/368
[58] Field of Search .................... 33/187, 188; 29/25–35; 310/368

[56] References Cited

U.S. PATENT DOCUMENTS

| 4,649,310 | 3/1987 | Nakamora et al. ............... 310/312 X |
| 5,426,401 | 6/1995 | Ogawa et al. ........................ 333/188 |

FOREIGN PATENT DOCUMENTS

| 0204582 | 11/1983 | Germany .............................. 310/312 |
| 4328211 | 12/1943 | Japan . | |
| 0114015 | 9/1980 | Japan ..................................... 310/312 |

*Primary Examiner*—Robert Pascal
*Assistant Examiner*—Justin P. Bettendorf
*Attorney, Agent, or Firm*—Ostrolenk Faber Gerb & Soffen, LLP

[57] ABSTRACT

In a piezoelectric resonator 11 in which resonance electrodes 13 and 14 are formed on both major surfaces of a rectangular plane piezoelectric plate 12 and which utilizes stretching vibration along the short side of the piezoelectric plate 12, notches 15 and 16 are partially formed on the long sides of the piezoelectric plate 12, respectively in order to increase the resonance frequency.

32 Claims, 3 Drawing Sheets

5,736,911

PIEZOELECTRIC RESONATOR WITH A RESONANCE FREQUENCY ADJUSTING NOTCH

This is a Continuation of application Ser. No. 08/647,013, filed May 8, 1996, now abandoned, which is a Continuation of application Ser. No. 08/429,892, now abandoned, filed Apr. 27, 1995.

BACKGROUND OF THE INVENTION

1. Field of the Invention

The present invention relates generally to a piezoelectric resonator and a method of adjusting the resonance frequency thereof, and more particularly, to a piezoelectric resonator having a structure in which the resonance frequency thereof can be adjusted to the increase the resonance frequency and a method of adjusting the resonance frequency thereof.

2. Description of the Prior Art

Various types of piezoelectric resonators using a piezoelectric body have been conventionally known. In the piezoelectric resonator, there has been a strong requirement that its resonance frequency remains constant. This is difficult to achieve, however, due to variations in the degree of polarization and the processing dimensions of the piezoelectric body used. Therefore, the resonance frequency of the piezoelectric resonator obtained is liable to vary. Further, in the piezoelectric resonator using piezoelectric ceramics, the sintering conditions and the material constant must vary. Even when the variations in the processing processes are very small, therefore, the resonance frequency is liable to vary to some extent in the piezoelectric resonator obtained.

On the other hand, in the market, it has been more strongly demanded that the initial variation of the electronic components are reduced to improve the electronic equipment performance.

Also in a piezoelectric resonator utilizing stretching vibration along the long side or the short side of a piezoelectric plate having a rectangular plane shape, for example, it has been strongly demanded that the above described initial variation of the resonance frequency be decreased.

In the above described piezoelectric resonator using a piezoelectric plate having a rectangular plane shape, the resonance frequency thereof is determined by the length and the width thereof. In order to reduce the variation in the resonance frequency of the above described piezoelectric resonator, (1) a method of adding a mass adding member such as rubber to the entire major surface of the piezoelectric resonator, (2) a method of cutting the center of the major surface, or the like has been proposed.

However, both the above described (1) method of adding a mass and (2) method of cutting the center of the major surface used to decrease the resonance frequency of the piezoelectric resonator to adjust the resonance frequency. Consequently, the above described methods cannot cope with a case where the resonance frequency is lower than the desired resonance frequency.

It is possible to increase the resonance frequency by decreasing the length or the width of the above described piezoelectric resonator. When the dimensions of the piezoelectric resonator are changed, however, the piezoelectric resonator differs in the external dimensions, although the resonance frequency thereof is the same. Therefore, a case containing the piezoelectric resonator and other components connected to the piezoelectric resonator must be changed, for example, which is not practical.

SUMMARY OF THE INVENTION

An object of the present invention is to provide, in a piezoelectric resonator utilizing a stretching mode of vibration wherein the resonator stretches along the long side or the short side of a rectangular piezoelectric plate a stretching direction extending along either a piezoelectric resonator having a structure in which the resonance frequency thereof can be increased without changing the external dimensions thereof even in a case where the resonance frequency is lower than a desired resonance frequency and a method of adjusting the resonance frequency of the piezoelectric resonator.

According to the present invention, there is provided a piezoelectric resonator utilizing stretching vibration along the long side or the short side of a piezoelectric plate in a rectangular plane shape, which comprises a piezoelectric plate in a rectangular plane shape and resonance electrodes formed on both major surfaces of the piezoelectric plate, a notch being partially provided on a side of the piezoelectric plate which is orthogonal to the direction of the stretching vibration utilized.

In accordance with a particular aspect of the present invention, the above described notch is formed around the center of the side which is orthogonal to the direction of the stretching vibration, thereby to make it possible to effectively increase the resonance frequency.

Preferably, the above described notch is formed on opposite two sides which are orthogonal to the direction of the stretching vibration, thereby to make it possible to further increase the resonance frequency, as compared with that in a case where the notch is formed on only one side.

Furthermore, in the piezoelectric resonator according to the present invention, resonance electrodes are respectively formed on both major surfaces of the piezoelectric plate. In this case, the resonance electrodes may be formed on both the entire major surfaces. Alternatively, the resonance electrode formed on one of the major surfaces may be constituted by a plurality of resonance electrodes so as to constitute a filter.

Additionally, the method of adjusting the resonance frequency of a piezoelectric resonator according to the present invention comprises the steps of preparing a piezoelectric resonator having a piezoelectric plate in a rectangular plane shape and resonance electrodes formed on both major surfaces of the piezoelectric plate and partially forming a notch on a side of the piezoelectric resonator which is orthogonal to the direction of stretching vibration utilized to adjust the resonance frequency in the direction in which the resonance frequency is increased.

Also in the direction in which the resonance frequency of the piezoelectric resonator is adjusted according to the present invention, the above described notch is preferably formed in the center of the side which is orthogonal to the direction of the stretching vibration, thereby to make it possible to effectively increase the resonance frequency.

In forming the above described notch, the notch is preferably formed in opposite two sides which are orthogonal to the direction of the stretching vibration. Consequently, it is possible to more effectively increase the resonance frequency, as compared with that in a case where the notch is formed on only one side.

Additionally, as the above described piezoelectric resonator, a piezoelectric resonator having a structure in which resonance electrodes are respectively formed on both major surfaces of a piezoelectric plate can be used.

Alternatively, the direction in which the resonance frequency is adjusted according to the present invention is also applicable to a piezoelectric resonator having a structure in which a plurality of resonance electrodes are formed on one major surface so as to constitute a filter.

As a result of examination to achieve the above described subject, the inventor of the present application has found out that the resonance frequency can be increased if the notch is formed as described above on the side which is orthogonal to the direction of the stretching vibration utilized in the piezoelectric resonator using the piezoelectric plate in a rectangular plane shape to make the present invention. That is, the present invention is experimentally confirmed by the inventor of the present application.

It has been known that with respect to a resonator made from a square plate, a notch is formed on a side surface of a piezoelectric substrate, thereby to make it possible to decrease the resonance frequency (Japanese Patent Publication No. 28211/1968). However, it should be pointed out that a method described in the prior art is only for adjusting the resonance frequency in the direction in which the resonance frequency is decreased, which is entirely different from the present invention.

As described in the foregoing, in a piezoelectric resonator and a method of adjusting the resonance frequency thereof according to the present invention, the notch is partially formed on the side which is orthogonal to the direction of the stretching vibration utilized. Accordingly, the resonance frequency of the piezoelectric resonator utilizing the stretching vibration along the long side or the short side of the piezoelectric plate in a rectangular plane shape can be so adjusted as to be increased. By utilizing the present invention, therefore, it is possible to reliably provide a piezoelectric resonator having an objective resonance frequency, thereby to make it possible to decrease the variation in the resonance frequency of the piezoelectric resonator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
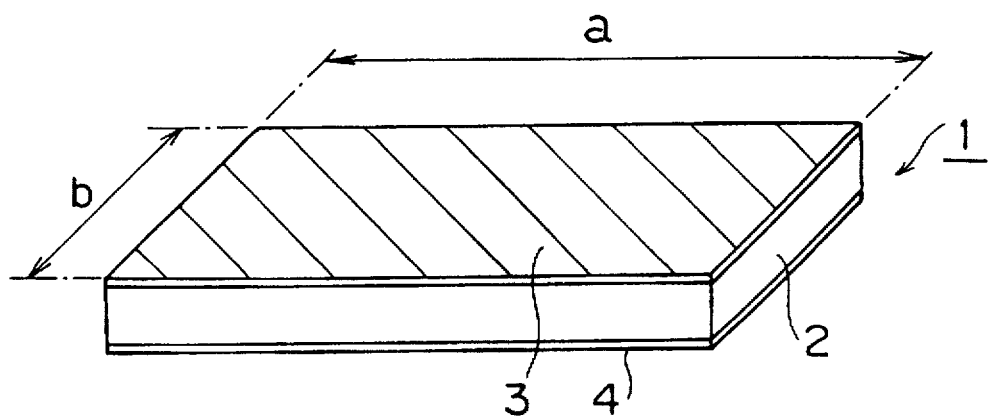
FIG. 1 is a perspective view showing a conventional piezoelectric resonator which is the premise of the present invention.

FIG. 1 is a perspective view showing a piezoelectric resonator having a rectangular plane shape in which resonance electrodes 3 and 4 are formed on the entirety of both major surfaces of a piezoelectric plate 2. The piezoelectric plate 2 is composed of piezoelectric ceramics, for example, which is subjected to polarization processing so that the axis of polarization is aligned with the thickness direction.

An AC voltage is applied to the resonance electrodes 3 and 4, whereby the piezoelectric resonator 1 vibrates in various modes of vibration. In this example, a stretching vibration in a direction parallel to the direction of the short side is strongly excited, thereby resulting in a resonator utilizing the vibration mode in that direction.

The piezoelectric resonator according to the present embodiment has a structure in which notches are partially provided in sides which are orthogonal to the direction of the vibration in the vibration mode utilized with respect to the above described piezoelectric resonator 1.

Figure 2A:
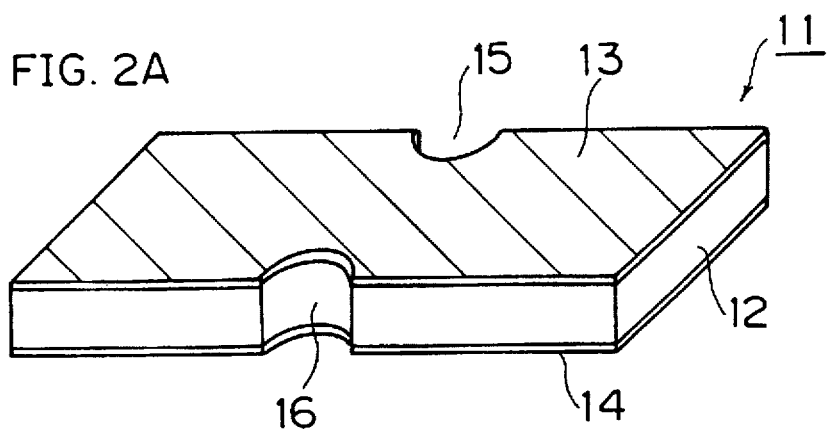
FIGS. 2A and 2B are a perspective view and a plan view showing a piezoelectric resonator according to one embodiment of the present invention.
Figure 2B:
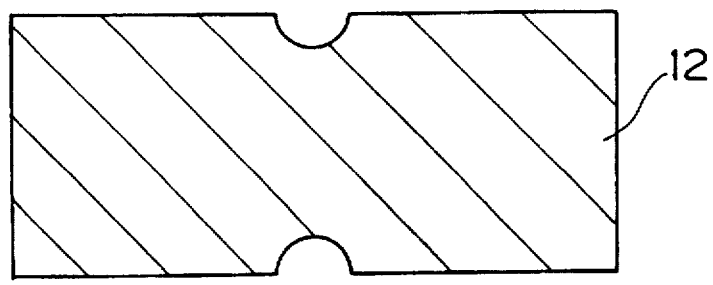

FIGS. 2A and 2B are a perspective view and a plane view, respectively, showing a piezoelectric resonator according to one embodiment of the present invention.

A piezoelectric resonator 11 is constructed using a piezoelectric plate 12 having a rectangular plane shape, which has notches 15 and 16 respectively formed in its long side portions. The piezoelectric plate 12 is composed of a piezoelectric material such as piezoelectric ceramics, and is subjected to polarization processing so that the axis of polarization is aligned with the thickness direction.

Resonance electrodes 13 and 14 are formed on both entire major surfaces of the piezoelectric plate 12. An AC voltage is applied to the resonance electrodes 13 and 14, whereby a stretching vibration in a direction parallel to the short side is strongly excited.

In the present embodiment, the notches 15 and 16 are formed in sides which are orthogonal to the above described stretching vibration along the short side, that is, the long sides. The notches 15 and 16 are formed in a semicircular plane shape. In the piezoelectric resonator 11 according to the present embodiment, the notches 15 and 16 are formed, thereby to make it possible to increase the resonance frequency, as compared with the piezoelectric resonator 1 shown in FIG. 1. This will be described on the basis of the specific experimental example.

For comparison, the piezoelectric resonator 1 shown in FIG. 1 was first produced. The piezoelectric plate 2 was composed of lead titanate zirconate, and had a length a of 2.84 mm, a width b of 2.03 mm and a thickness of 0.35 mm. The resonance electrodes 3 and 4 were formed by applying silver.

The resonance frequency, the resonant resistance, the antiresonance frequency, and the difference ΔF between the resonance frequency and the antiresonance frequency of the piezoelectric resonator 1 in the conventional example obtained in the above described manner were measured. The results are shown in the following Table 1.

A first experimental embodiment was produced by forming a pair of notches 15 and 16 in the long sides of the resonator 1. Notches 15 and 16 were semicircular in shape and had a diameter of 0.2 mm as shown in FIG. 2. The notches were formed by cutting using a diamond wheel.

Figure 3:
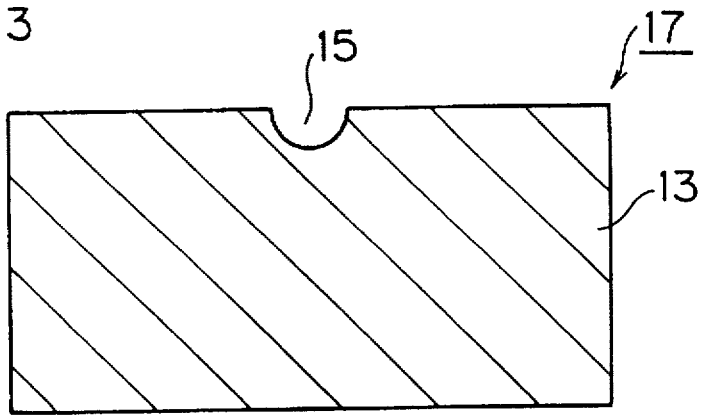
FIG. 3 is a plan view showing a piezoelectric resonator according to an embodiment 2.

Furthermore, a notch 15 in the same semicircular plane shape having a diameter of 0.2 mm was formed using a diamond wheel on one long side of the above described piezoelectric resonator in the conventional example. That is, a piezoelectric resonator 17 shown in FIG. 3 (an embodiment 2) was produced.

The resonance frequency, the resonant resistance, the antiresonance frequency, the difference ΔF between the resonance frequency and the antiresonance frequency of the piezoelectric resonators according to the embodiments 1 and 2 obtained in the above described manner are measured. The results were shown in the following Table 1.

TABLE 1

|  | Resonance Frequency (KHz) | Resonant Resistance (Ω) | Antiresonance Frequency (KHz) | Difference ΔF Between Resonance Frequency and Antiresonance Frequency (KHz) |
| --- | --- | --- | --- | --- |
| Embodiment 1 | 990.45 | 18.0 | 1020.15 | 29.7 |
| Embodiment 2 | 989.25 | 17.9 | 1019.25 | 30.00 |
| Coventional Example | 986.75 | 17.8 | 1017.20 | 30.45 |

As can be seen from Table 1, the resonance frequencies of the piezoelectric resonators according to the embodiments 1 and 2 were increased relative to that of the piezoelectric resonator in the conventional example. Further, as can be seen a comparison between the embodiments 1 and 2, in a case where notches are formed on opposite two sides, the resonance frequency of the piezoelectric resonator was further increased, as compared with that in a case where a notch is formed on one long side only. Further, it was found that in both of the piezoelectric resonators according to the embodiments 1 and 2, the other resonance characteristics such as the difference ΔF between the resonance frequency are approximately equal to the piezoelectric resonator in the conventional example and the antiresonance frequency. The antiresonance frequency rises with the resonance frequency. Therefore, it is found that the resonance frequency can be adjusted in the direction in which the resonance frequency is increased by forming a notch on a side which is orthogonal to the direction of vibration utilized in a piezoelectric resonator in a rectangular plane shape.

As described above, the reason why the resonance frequency of vibration along the width (the short side) can be so adjusted as to be increased is that the resonance frequency is determined by the width. It is considered that the equivalent width of the piezoelectric resonator can be apparently decreased by providing a notch.

Although in the above described embodiments, the notches 15 and 16 are formed by cutting the piezoelectric plate using a diamond wheel, the notches can be formed by other methods such as partially burning off the piezoelectric plate using a laser or forming notches in a piezoelectric body in a block shape using a dicer or the like and then, slicing the notches.

Figure 4A:
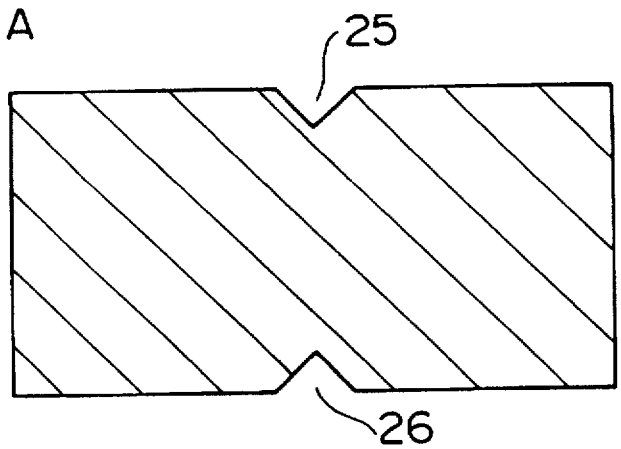
FIGS. 4A and 4B are plan views showing a piezoelectric resonator for explaining a modified example of the shape of a notch.
Figure 4B:
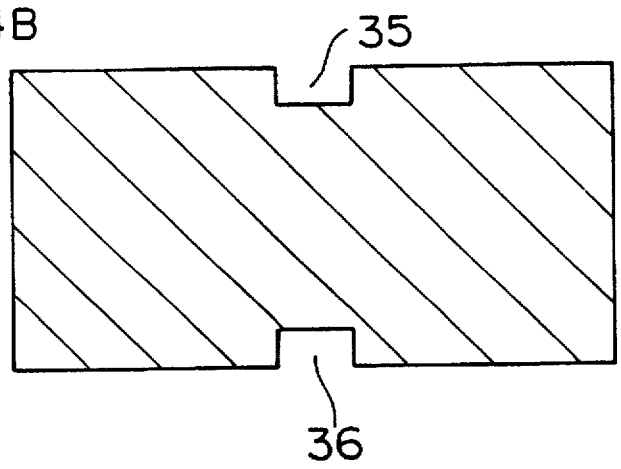

Although in the above described embodiment, the notches 15 and 16 are in a semicircular plane shape, notches 25 and 26 and notches 35 and 36 which are respectively in a V plane shape and a rectangular plane shape may be formed, as shown in FIGS. 4A and 4B.

Figure 5A:
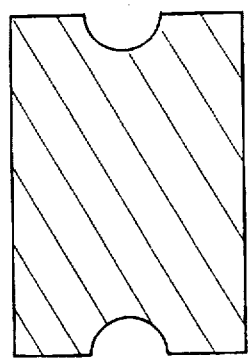
FIGS. 5A–5C are plan views showing the notch on the short side of the piezoelectric resonator.
Figure 5B:
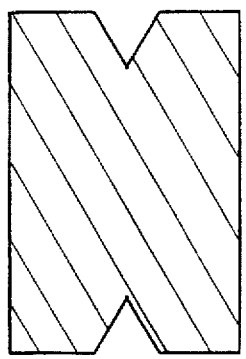
Figure 5C:
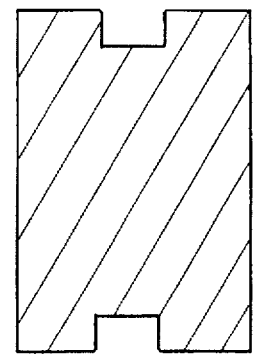

Furthermore, although in the above described embodiments, the vibration mode utilized is a stretching vibration along the short side of the piezoelectric plate in a rectangular plane shape, the present invention is also applicable to a piezoelectric resonator utilizing stretching vibration along the long side, thereby to make it possible to similarly increase the resonance frequency thereof. For example, FIGS. 5A, 5B, and 5C show embodiments wherein the notches are formed on the short side.

Additionally, a dynamic damper utilizing a known dynamic damping phenomenon can be also connected to the piezoelectric resonator according to the present invention to also trap vibrational energy in a portion to the dynamic damper.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator, comprising:

a rectangular parallelpiped piezoelectric plate having opposed main surfaces connected by a pair of shorter side surfaces and a pair of longer side surfaces;

resonance electrodes formed on the opposed main surfaces of the plate, the piezoelectric plate and the resonance electrodes cooperating to cause the piezoelectric plate to vibrate along a direction which is parallel to the longer side surface of the piezoelectric plate; and a notch being provided on one of the shorter side surfaces of the piezoelectric plate at a position intermediate and removed from the two longer side surfaces of the piezoelectric plate.

2. The piezoelectric resonator of claim 1, wherein the notch is provided at a location half way between the two longer side surfaces of the piezoelectric plate.

3. The piezoelectric resonator of claim 1, wherein the notch is semicircular in shape.

4. The piezoelectric resonator of claim 1, wherein the notch is V shaped.

5. The piezoelectric resonator of claim 1, further including a beyond notch provided on the other of the shorter side surfaces of the piezoelectric plate at a position intermediate and removed from the two longer side surfaces of the piezoelectric plate.

6. The piezoelectric resonator of claim 5, wherein the notches are provided at locations half way between the two longer side surfaces of the piezoelectric plate.

7. The piezoelectric resonator of claim 5, wherein the notches are semicircular in shape.

8. The piezoelectric resonator of claim 5, wherein the notches are V shaped.

9. A piezoelectric resonator, comprising:.

a rectangular parallelpiped piezoelectric plate having opposed main surfaces connected by a pair of shorter side surfaces and a pair of longer side surfaces;

resonance electrodes formed on the opposed main surfaces of the plate, the piezoelectric plate and the resonance electrodes cooperating to cause the piezoelectric plate to vibrate along a direction which is parallel to the shorter side surface of the piezoelectric plate; and a notch being provided on, one of the longer side surfaces of the piezoelectric plate at a position intermediate and removed from the two shorter side surfaces of the piezoelectric plate.

10. The piezoelectric resonator of claim 9, wherein the notch is provided at a location half way between two shorter side surfaces of the piezoelectric plate.

11. The piezoelectric resonator of claim 9, wherein the notch is semicircular in shape.

12. The piezoelectric resonator of claim 9, wherein the notch is V shaped.

13. The piezoelectric resonator of claim 9, further including a second notch provided on the other of the longer side surfaces of the piezoelectric plate at a position intermediate and removed from the two shorter side surfaces of the piezoelectric plate.

14. The piezoelectric resonator of claim 13, wherein the notches are provided at locations half way between the two shorter side surfaces of the piezoelectric plate.

15. The piezoelectric resonator of claim 13, wherein the notches are semicircular in shape.

16. The piezoelectric resonator of claim 13, wherein the notches are V shaped.

17. A method of adjusting the resonance frequency of a piezoelectric resonator of the type which includes a rectangular parallelpiped piezoelectric plate having opposed main surfaces connected by a pair of shorter side surfaces and a pair of longer side surfaces and resonance electrodes formed on the opposed main surfaces of the plate, the piezoelectric plate and the resonance electrodes cooperating to cause the piezoelectric plate to vibrate along a direction which is parallel to the longer side surfaces of the piezoelectric plate, the method comprising the step of:

forming a notch on one of the shorter side surfaces of the piezoelectric plate at a position intermediate and removed from the two longer side surfaces of the piezoelectric plate.

18. The method of claim 17, wherein the notch is provided at a location half way between the two longer side surfaces of the piezoelectric plate.

19. The method of claim 17, further including the step of forming a second notch on the other of the shorter side surfaces of the piezoelectric plate at a position intermediate and removed from the two longer side surfaces of the piezoelectric plate.

20. The method of claim 17, wherein the notch is formed to be semicircular in shape.

21. The method of claim 17, wherein the notch is formed to be V shaped.

22. The method of claim 19, wherein the notches are formed at a location half way between the two longer side surfaces of the piezoelectric plate.

23. The method of claim 22, wherein the notches are formed to be semicircular in shape.

24. The method of claim 22, wherein the notches are formed to be V shape&.

25. A method of adjusting the resonance frequency of a piezoelectric resonator of the type which includes a rectangular parallelpiped piezoelectric plate having opposed main surfaces connected by a pair of shorter side surfaces and a pair of longer side surfaces and resonance electrodes formed on the opposed main surfaces of the plate, the piezoelectric plate and the resonance electrodes cooperating to cause the piezoelectric plate to vibrate along a direction which is parallel to the shorter side surfaces of the piezoelectric plate, the method comprising the step of:

forming a notch on one of the longer side surfaces of the piezoelectric plate at a position intermediate and removed from the two shorter side surfaces of the piezoelectric plate.

26. The piezoelectric resonator of claim 25, wherein the notch is provided at a location half way between the two shorter side surfaces of the piezoelectric plate.

27. The method of claim 25, wherein the notch is formed to be semicircular in shape.

28. The piezoelectric resonator of claim 25, wherein the notch is formed to be V shaped.

29. The method of claim 25, further including the step of forming a second notch on the other of the longer side surfaces of the piezoelectric plate at a position intermediate and removed from the two shorter side surfaces of the piezoelectric plate.

30. The method of claim 29, wherein the notches are formed at a location half way between the two shorter side surfaces of the piezoelectric plate.

31. The method of claim 29, wherein the notches are formed to a semicircular in shape.

32. The method of claim 29, wherein the notches are formed to be V shaped.

* * * * *